United States Patent [19]
Iwabuchi et al.

[11] Patent Number: 5,894,124
[45] Date of Patent: Apr. 13, 1999

[54] SCANNING ELECTRON MICROSCOPE AND ITS ANALOGOUS DEVICE

[75] Inventors: Yuko Iwabuchi, Mito; Mitsugu Sato, Hitachinaka; Yoichi Ose, Mito, all of Japan

[73] Assignee: Hitachi, Ltd., Tokyo, Japan

[21] Appl. No.: 08/866,304

[22] Filed: May 30, 1997

Related U.S. Application Data

[63] Continuation-in-part of application No. 08/615,650, Mar. 13, 1996, Pat. No. 5,668,372.

[30] Foreign Application Priority Data

Mar. 17, 1995 [JP] Japan ......................... 7-59376

[51] Int. Cl.⁶ .................................... H01J 37/244
[52] U.S. Cl. ................................................ 250/310
[58] Field of Search ........................ 250/310, 396 R, 250/396 ML, 397

[56] References Cited

U.S. PATENT DOCUMENTS

| | | |
|---|---|---|
| 4,658,136 | 4/1987 | Ohtaka et al. .................. 250/310 |
| 4,922,097 | 5/1990 | Todokoro et al. ............... 250/310 |
| 5,387,743 | 2/1995 | Sato et al. ...................... 250/310 |
| 5,608,218 | 3/1997 | Sato et al. ...................... 250/310 |
| 5,677,530 | 10/1997 | Sato et al. .................... 250/310 |

*Primary Examiner*—Kiet T. Nguyen
*Attorney, Agent, or Firm*—Kenyon & Kenyon

[57] ABSTRACT

The device of the present invention enables high resolution observation even when a sample is tilted. A deflecting electrode device for generating an electric field having a component in the direction perpendicular to the center axis (optical axis) of an objective lens is provided between the objective lens and the sample. A voltage applied to the deflecting electrode device is controlled in accordance with the tilting of a sample stage. A lateral electric field component generated on the optical axis when the sample stage is tilted is corrected by a deflected electric field generated by the deflecting electrode device. This is effective to suppress generation of astigmatism, and to allows effective arrival of an secondary electron at a secondary electron detector disposed at a position nearer the electron source side than the objective lens.

28 Claims, 9 Drawing Sheets

SCANNING ELECTRON MICROSCOPE AND ITS ANALOGOUS DEVICE

This application is a CIP of Ser. No. 08/615,650, filed Mar. 13, 1996, now U.S. Pat. No. 5,668,372.

BACKGROUND OF THE INVENTION

The present invention relates to a device suitable for obtaining a scanning image of a sample on the basis of an information signal, peculiar to the sample, obtained by emission of an electron beam to the sample.

A method for observing a sample at high resolution using a scanning electron microscope or the like has been described in Japanese Patent Laid-open No. Sho 57-172643, in which a lens magnetic field is generated at a lower portion of an objective lens; a secondary electron generated from the sample is accelerated by a positive voltage applied to electrodes disposed on an objective lens portion; and the secondary electron is detected at a portion over the objective lens. On the other hand, a so-called retarding method is intended to decelerate a primary electron directly before a sample by applying a negative voltage to the sample. Even in this retarding method, a secondary electron generated from a sample is accelerated by a voltage applied to the sample and advances over the objective lens, and thereby it must be detected at a portion over the objective lens. In each method, an electric field is generated between the sample and the objective lens.

In the above-described prior art methods, when a conductive sample is tilted, an axisymmetric property of an electric field between a sample and an objective lens is put into disorder, and consequently a lateral electric field component is generated on the optical axis of the electron beam. This is inconvenient in increasing astigmatism, thereby making poor resolution. The disorder of the axisymmetric property of an electric field also disturbs the orbit of a secondary electron generated from the sample, and obstructs effective arrival of the secondary electron at a detector disposed over the objective lens. This results in lowering of the detection efficiency of the secondary electron.

SUMMARY OF THE INVENTION

An object of the present invention is to provide a scanning electron microscope and its analogous device suitable for suppressing generation of astigmatism even when a sample stage is tilted, thereby preventing lowering of resolution.

Another object of the present invention is to provide a scanning electron microscope and its analogous device suitable for preventing lowering of a detection efficiency of a secondary electron detected after passing through an objective lens.

Main features of the present invention are as follows.

A scanning electron microscope and its analogous device according to a first aspect of the present invention, includes: an electron gun for generating an electron beam; an objective lens for converging the electron beam to a sample so as to allow emission of the electron beam on the sample; a deflector for deflecting the electron beam so as to allow the electron beam to scan the sample; a detector for detecting an information signal, peculiar to the sample, generated from the sample by emission of the electron beam; a means for tilting the sample with respect to the electron beam; and a means for correcting a nonaxisymmetric property, due to the tilting of the sample, of an electric field applied to the electron beam to be emitted on the sample; wherein the nonaxisymmetric property correcting means includes a deflecting electrode means to which a variable voltage is applied for generating an electric field having a component in the direction perpendicular to the optical axis of the electron beam.

A scanning electron microscope and its analogous device according to a second aspect of the present invention, includes: an electron gun for generating an electron beam; an objective lens converging the electron beam to a sample so as to allow emission of the electron beam on the sample; a means for deflecting the electron beam so as to allow the electron beam to scan the sample; a means for generating an electric field having a component in the direction of the optical axis of the electron beam so as to extract, through said objective lens, a secondary electron generated from the sample by emission of the electron beam; a detector for detecting the extracted secondary electron; a means for tilting the sample with respect to the electron beam; and a means for correcting a nonaxisymmetric property, due to the tilting of the sample, of the electric field applied to the electron beam to be emitted on the sample; wherein the nonaxisymmetric property correcting means includes a deflecting electrode device to which a variable voltage is applied for generating an electric field having a component in the direction perpendicular to the optical axis of the electron beam.

The above scanning electron microscope and its analogous device may further include a means for detecting a tilting angle of the sample and controlling the voltage applied to the deflecting electrode device on the basis of the detected tilting angle.

In the above scanning electron microscope and its analogous device, the deflecting electrode device may include at least two pieces of electrodes disposed between said objective lens and the sample in such a manner as to be positioned around the optical axis of the electron beam.

In the above scanning electron microscope and its analogous device, said deflecting electrode device may include deflecting electrodes disposed opposite to the sample with respect to the optical axis of the electron beam.

As described above, the present invention includes at least a means for correcting a nonaxisymmetric property, due to the tilting of the sample, of an electric field applied to the electron beam to be emitted on the sample, wherein the nonaxisymmetric property correcting means includes a deflecting electrode means to which a variable voltage is applied for generating an electric field having a component in the direction perpendicular to the optical axis of the electron beam. Accordingly, when a sample is tilted, generation of astigmatism can be suppressed by changing a voltage applied to the deflecting electrode means for generating an electric field component being large sufficient to compensate for an irregular electric component generated in the direction perpendicular to the optical axis of the electron beam, to thereby prevent lowering of resolution due to the astigmatism.

The generation of an effective electric field component by the deflecting electrode mean exhibits another effect. Specifically, when a secondary electron generated from a tilted sample is detected after being extracted through an objective lens, an irregular electric field component generated in the direction perpendicular to the optical axis of the electron beam disturbs the orbit of the secondary electron, thereby lowering the detection efficiency of the secondary electron. The lowering of the detection efficiency of the secondary electron, however, can be prevented by changing a voltage applied to the deflecting electrode means for generating an electric field component being large sufficient to compensate for the irregular electric field component.

In addition, the device of the present invention is excellent in operability because a voltage applied to the deflecting electrode means can be changed in accordance with the tilting of a sample.

DESCRIPTION OF THE PREFERRED EMBODIMENT

Figure 1:
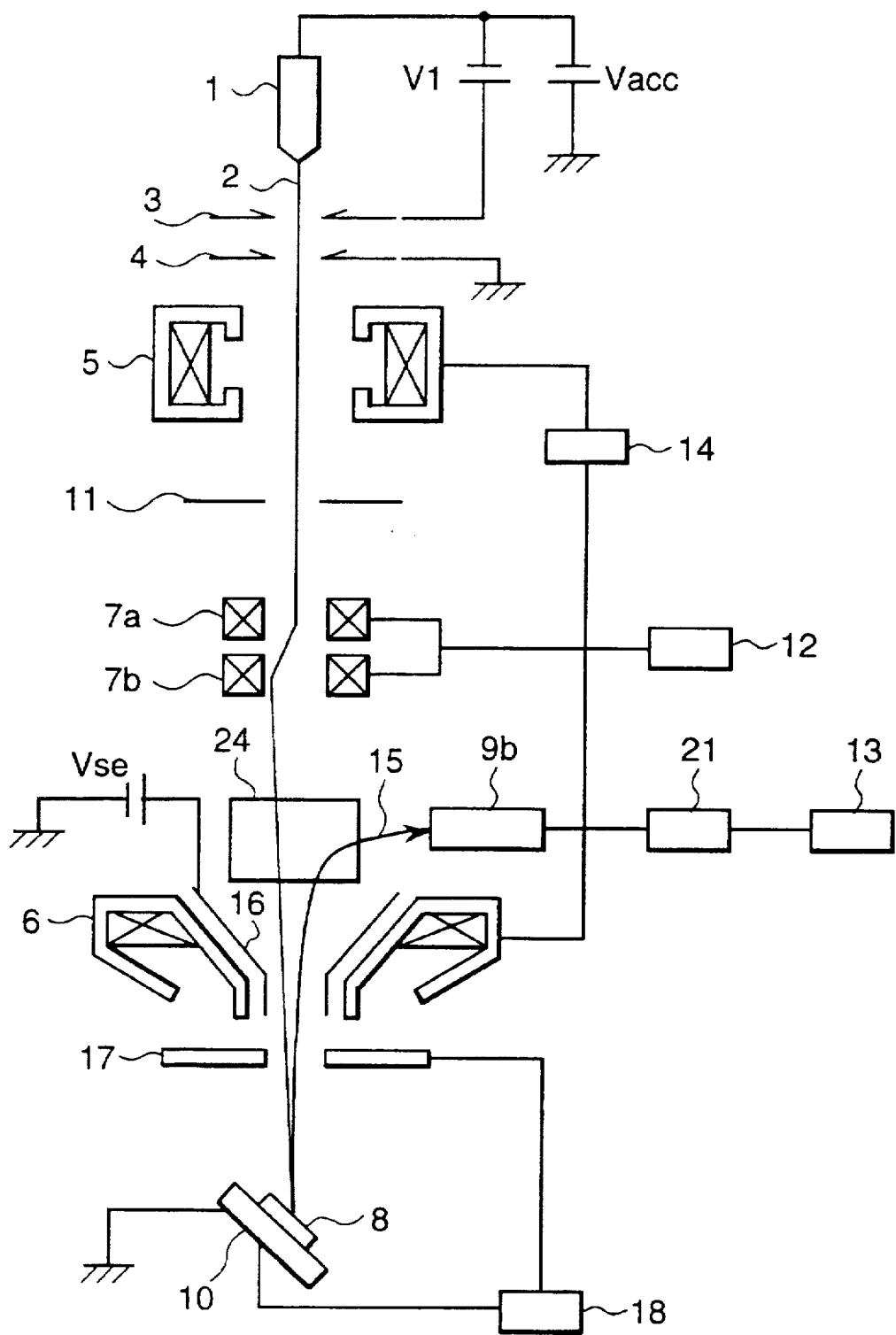
FIG. 1 is a schematic view showing a configuration of one embodiment of a scanning electron microscope according to the present invention.
Figure 2:
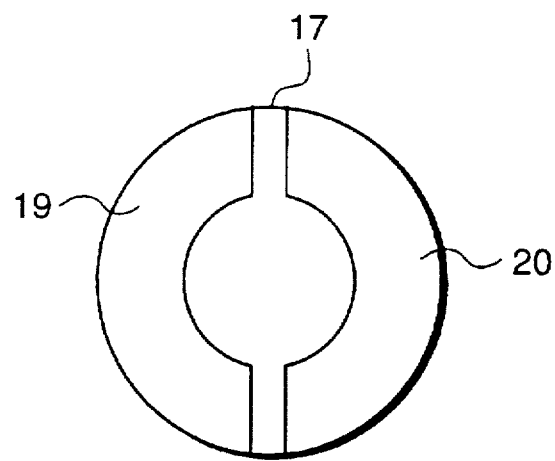
FIG. 2 is a view showing a configuration of a deflecting electrode shown in FIG. 1.

FIG. 1 is a view showing a configuration of one embodiment of the present invention. When a voltage V1 is applied between a cathode 1 of an electron gun and an extraction electrode 3, a primary electron beam 2 is discharged from the cathode 1. The primary electron beam 2 is accelerated by a voltage Vacc applied between the cathode 1 and an accelerating electrode 4, and is then emitted to be converged to a sample 8 through a convergent lens 5 controlled by a lens controller 14 and an objective lens 6. Deflectors 7a, 7b deflect the primary electron beam 2 two-dimensionally so that the primary electron 2 scans the sample 8 two-dimensionally. A scanning signal supplied to the deflectors 7a, 7b is controlled by a deflection control circuit 12 on the basis of an observation magnification. An information signal electron 15 generated from the sample 8 by emission of the primary electron beam is accelerated by a voltage Vse applied to a lifting electrode 16, and is detected by an information signal electron detector 9b by way of the objective lens 6. An enlarged image of the sample is thus displayed on an image display 13. In addition, reference numeral 21 indicates an amplifier. During passing through the objective lens, the primary electron beam 2 is accelerated by a positive voltage applied to the lifting electrode 16 in proportion to the magnitude of the applied positive voltage. Consequently, the primary electron beam 2 has a high accelerating voltage during passing through the objective lens 6, so that the aberration of the primary electron beam can be reduced. Further, after passing through the objective lens 6, the primary electron beam 2 is returned to the original state, that is, it has the original accelerating voltage, so that the sample can be prevented from being damaged by a highly accelerated primary electron beam. A deflecting electrode device 17 is composed of two electrodes 19, 20 symmetrically disposed with respect the optical axis of the electron beam, as shown in FIG. 2. Different voltages, which are respectively applied to the electrodes 19, 20, are controlled by a control unit 18 in accordance with the tilting of a sample stage 10 mounting the sample 8. The suitable selection of these voltages enables generation of an electric field component being large sufficient to compensate for an irregular electric field component generated in the direction perpendicular to the axis of the electron beam due to the tilting of the sample. This is effective to correct the nonaxisymmetric property, due to the tilting of the sample, of the electric field applied to the electron beam, and hence to suppress generation of astigmatism as a cause of lowering of resolution.

Further, since the disorder of the orbit of an information signal electron generated from the sample 8 can be suppressed by correcting the irregular electric field, the information signal electron can be efficiently introduced to a portion over the objective lens (electron source side).

The generation of an effective electric field component by the deflecting electrode device 17 exhibits another effect. Specifically, when an information signal electron generated from a tilted sample is detected after being extracted through an objective lens, an irregular electric field component generated in the direction perpendicular to the optical axis of the electron beam disturbs the orbit of the information signal electron, thereby lowering the detection efficiency of the information signal electron. The lowering of the detection efficiency of the information signal electron, however, can be prevented by changing a voltage applied to the deflecting electrode device 17 for generating an electric field component being large sufficient to compensate for the irregular electric field component.

A voltage applied to the deflecting electrode device 17 can be manually changed; however, the voltage is desirable to be automatically changed in practice. In this case, experiments have been made for obtaining a relationship for correcting an irregular electric field, that is, an nonaxisymmetric property of an electric field applied to an electron beam. In other words, a relationship of a voltage applied between the electrodes 19, 20 to a tilting angle of a sample has been previously obtained by experiments. Thus, the control unit 18 automatically changes, on the basis of the experimental results, a voltage applied between the electrodes 19, 20 in accordance with a variable tilting angle of the sample. In this embodiment, the control unit 18 serves as a source to apply a voltage to the deflecting electrode device 17; however, a power source unit may be provided separately from the control unit 18. An orthogonal electric field/magnetic field generator (L) 24 is disposed over the objective lens. The intensities of an electric field and a magnetic field generated from the orthogonal electric field/magnetic field generator (L) 24 are controlled such that deflecting actions are canceled each other for the primary electron beam and are exerted on the information electron detector 9b side for an information signal electron introduced over the objective lens. Accordingly, by provision of the orthogonal electric field/magnetic field generator (L) 24, the information signal electron generated from the sample can be efficiently detected by the information electron detector 9b without exerting any effect on the orbit of the primary electron.

Figure 3:
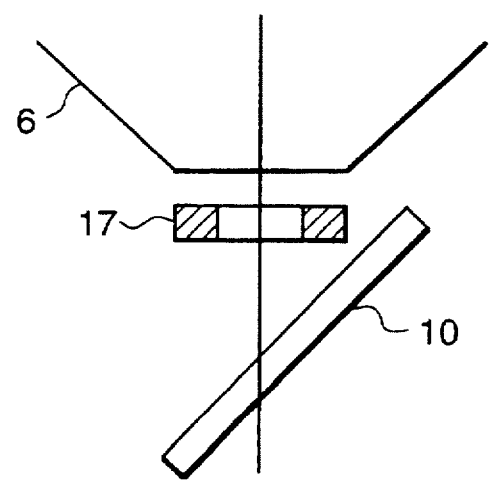
FIG. 3 is a view showing a positional relationship between an objective lens, a sample stage and the deflecting electrode shown in FIG. 1.
Figure 4:
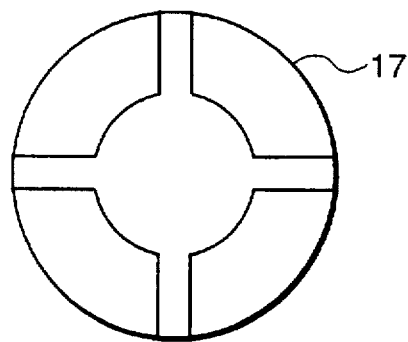
FIG. 4 is a view, similar to FIG. 2, showing another configuration of the deflecting electrode.
Figure 5:
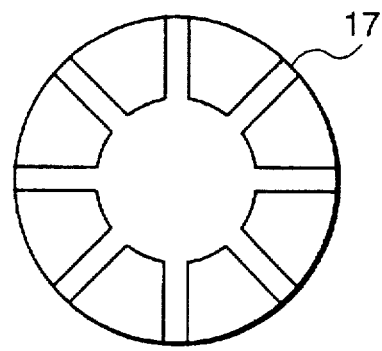
FIG. 5 is a view, similar to FIG. 2, showing a further configuration of the deflecting electrode.

FIG. 3 shows an arrangement example of the deflecting electrode device 17, in which the device 17 is arranged between the lower surface of the objective lens 6 and a sample in such a manner as to be positioned around the optical axis of an electron beam. As shown in FIGS. 2, 4 or 5, the deflecting electrode device 17 may be composed of two, four or eight electrodes for applying different voltages. A voltage applied to each electrode of the deflecting electrode device 17 is automatically controlled in accordance with the tilting of the sample stage 10, that is, the sample 8 by the control unit 18. In this case, it is apparent that lowering of resolution can be prevented and also effective detection of a information signal electron can be performed for the same reason as described above.

Figure 6:
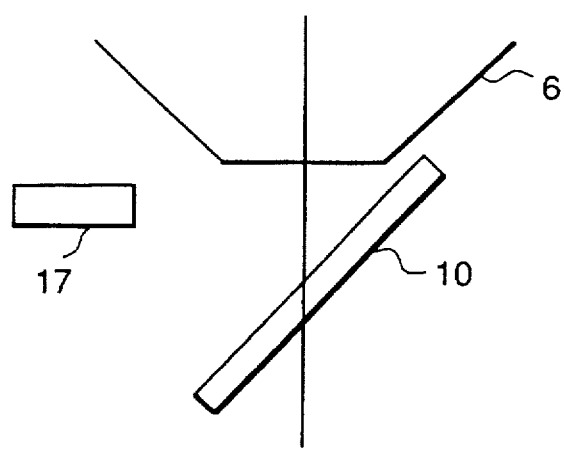
FIG. 6 is a view, similar to FIG. 3, showing another positional relationship between the objective lens, sample stage and deflecting electrode.

FIG. 6 shows another arrangement example of the deflecting electrode device 17, in which the device 17 is disposed opposite to the sample 8, that is, the sample stage 10 tilted with respect to the optical axis of an electron beam. A voltage applied to the device 17 is controlled in accordance with the tilting of the sample stage 10 by the control unit 18. Even in this case, when a voltage is applied to the deflecting electrode device 17, an electric field having a component in the direction perpendicular to the optical axis of the electron beam is generated. The electric field component thus generated corrects a lateral electric field component generated on the optical axis of the electron beam when the sample stage 10 is tilted, to suppress generation of astigmatism. As a result, it becomes possible to correct astigmatism, and information signal electron 15 that generate from the sample is directed efficiently to the upper part of an objective lens.

According to the embodiment of the present invention, generation of astigmatism can be prevented by changing a voltage applied to the deflecting electrode means for generating an electric field component being large sufficient to compensate for an irregular electric component generated in the direction perpendicular to the optical axis of the electron beam when a sample is tilted, to thereby prevent lowering of resolution due to the astigmatism.

The generation of an effective electric field component by the deflecting electrode mean 17 exhibits another effect. Specifically, when a secondary electron (in the case of the example shown in FIG. 1, the secondary electron is mainly regarded as the information signal electron) generated from a tilted sample is detected after being extracted through an objective lens, an irregular electric field component generated in the direction perpendicular to the optical axis of the electron beam disturbs the orbit of the secondary electron, thereby lowering the detection efficiency of the secondary electron. The lowering of the detection efficiency of the secondary electron, however, can be prevented by changing a voltage applied to the deflecting electrode means for generating an electric field component being large sufficient to compensate for the irregular electric field component.

In addition, the device of the present invention is excellent in operability because a voltage applied to the deflecting electrode means can be changed in accordance with the tilting of a sample.

The change in a voltage applied to the deflecting electrode device 17 will be fully described using the deflecting electrodes shown in FIG. 3.

The orbit of a secondary electron generated from a sample by emission of an electron beam is required to be changed in such a manner that the secondary electron is introduced to a secondary electron detector by way of the objective lens. To satisfy such requirement, in the case where the sample stage 10 mounting the sample is tilted as shown in FIG. 3, a voltage applied to the electrode which is separated apart from the sample stage is set on the negative side as compared with a voltage applied to the electrode which moves near the sample stage.

Specifically, although a secondary electron generated from the sample on the sample stage 10 directs in the perpendicular direction of the sample stage 10 due to the tilting of the sample stage 10, it is pushed back to the center axis of the objective lens by applying a voltage on the negative side to the electrode apart from the sample stage as compared with the electrode near the sample stage, thereby improving the detection efficiency of the secondary electron.

As long as the above relationship is kept, that is, a voltage on the negative side is applied to an electrode apart from the sample stage as compared with an electrode near the sample stage, the same effect as described above can be usually obtained even when a voltage applied to one electrode is zero or when positive voltages are applied to both the electrodes. Additionally, in the case where both the electrodes are applied with positive voltages, they function as the deflecting electrodes serving as extraction electrodes for a secondary electron.

Figure 7:
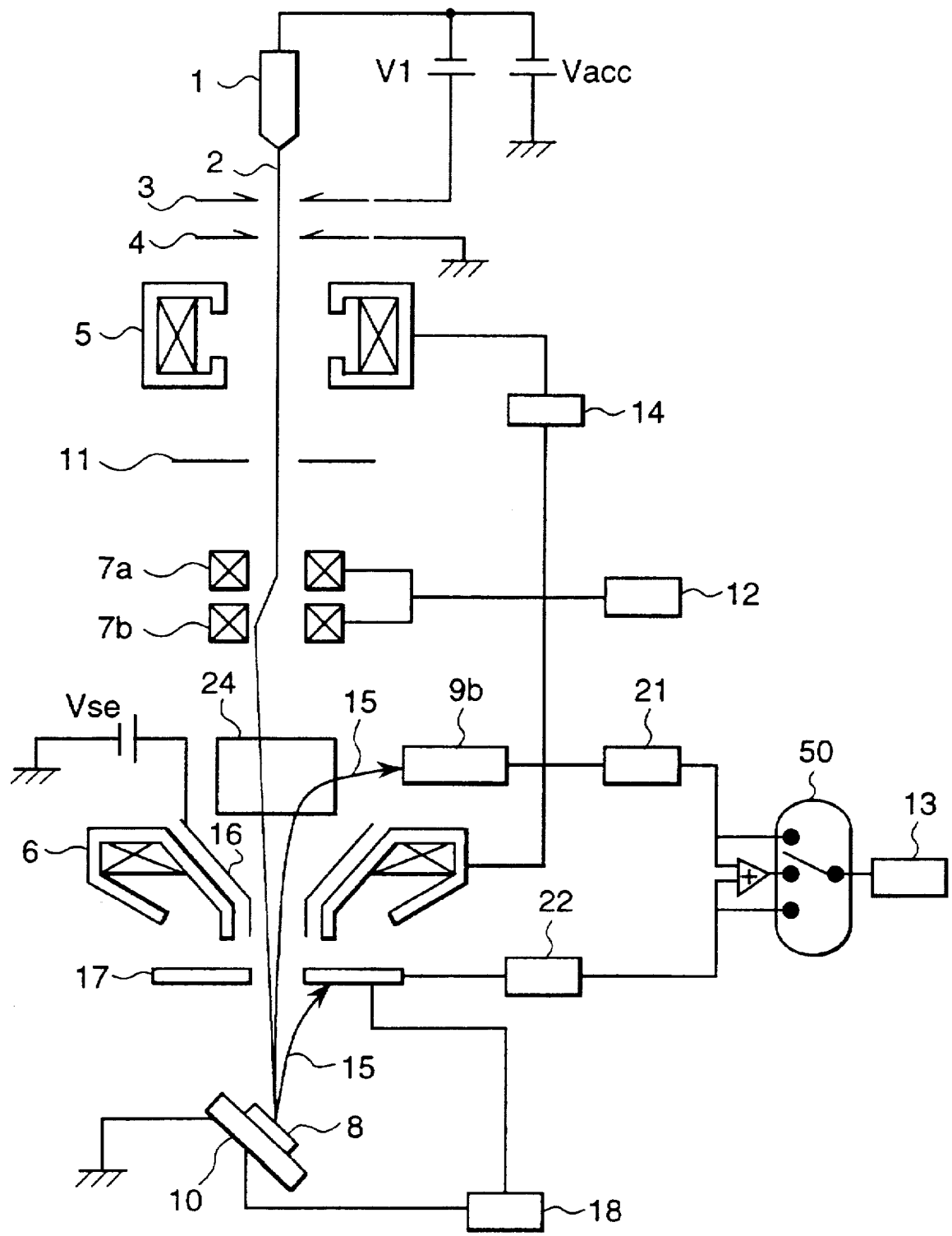
FIG. 7 is a view showing a configuration example in which a deflecting electrode is made of a material having a function of generating a light or electric signal when an electron collides therewith, and is used as a means for detecting an information signal electron.

FIG. 7 shows a configuration example in which the deflecting electrode 17 is made of a material having a function of generating a light or electric signal when an electron collides therewith, and is used as a mean for detecting the information signal electron 15.

Of the information signal electrons 15 generated from the sample 8 when the primary electron beam 2 is irradiated on the sample 8, those having low energies travel over the objective lens by the effect of the lifting voltage Vse; however, those having high energies (in particular, reflected electrons) are not sufficiently suppressed in divergence and thereby they partially collide with the deflecting electrode 17. When the information signal electrons 15 collide with the deflecting electrode 17, the deflecting electrode 17 generates light or electric signals corresponding to the amount of the signal electrons collided therewith, thereby obtaining an image signal. The image signal thus obtained from the deflecting electrode 17 is supplied through an amplifier 22 to the image display 13, and thus an enlarged image of the sample can be displayed on the image display 13.

The high energy signal electron detected by the deflecting electrode 17 and the low energy signal electron detected by the information signal detector 9b disposed over the objective lens 6 are selected to be used either as independent signals or as a synthesized signal by an information signal switching means 50 and displayed on the image display 13. The switching of the information signals allows only the suitable information of the information signals generated from the sample to be displayed. This prevents a reduction in S/N of an image due to unnecessary information signals.

Figure 8:
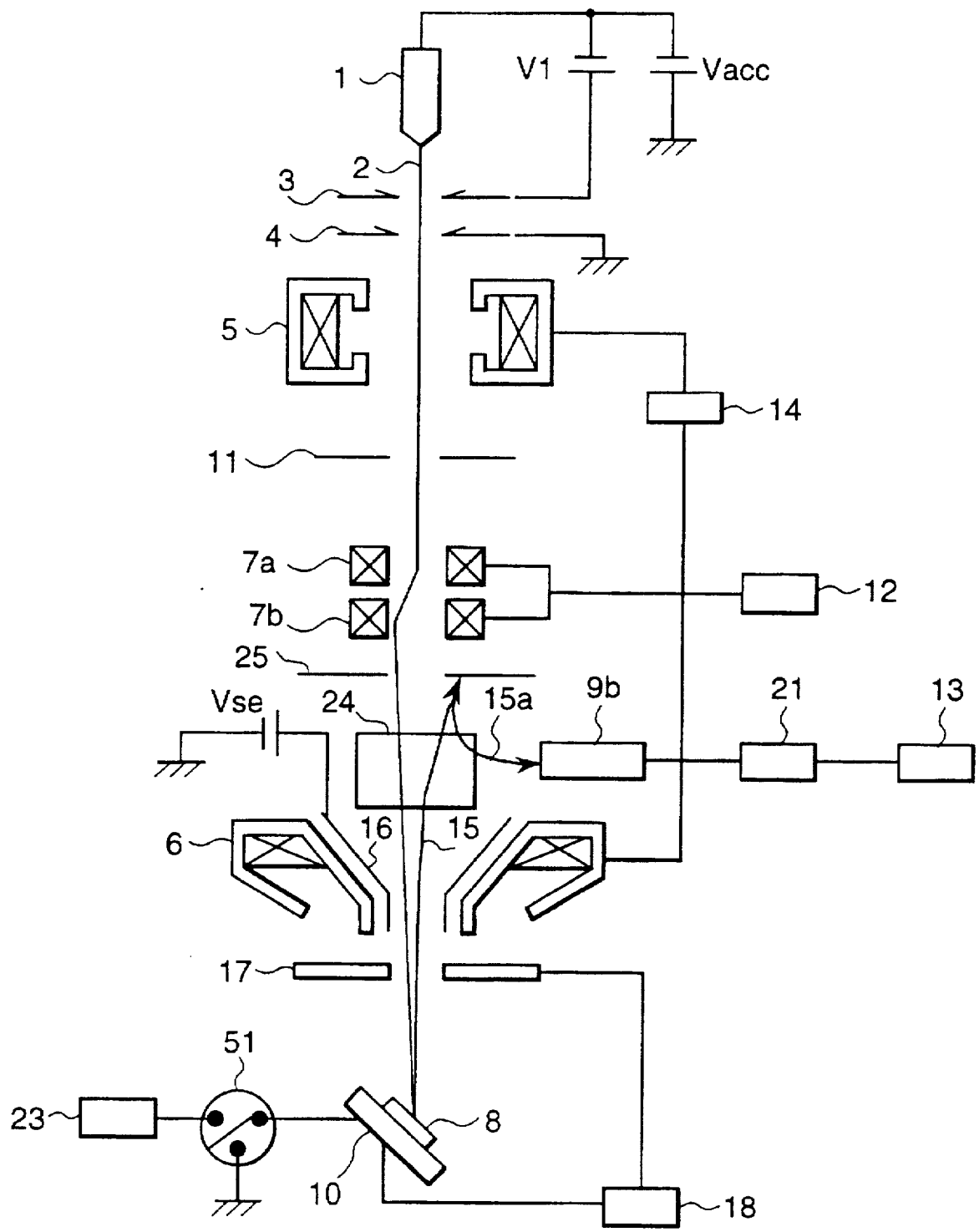
FIG. 8 is a view showing a configuration example in which a primary electron during passing through a magnetic field of an objective lens is decelerated between magnetic poles of the objective lens and a sample by applying a negative voltage to the sample.

FIG. 8 shows a configuration example in which a primary electron during passing through the magnetic field of the objective lens is decelerated between the magnetic poles of the objective lens and the sample by applying a negative voltage to the sample 8 using a voltage control unit 23. The orthogonal electric field/magnetic field generator (L) 24 for generating an electric field and a magnetic field orthogonal with each other, an electrode (L) 25 made of a material capable of generating a secondary electron when an electron collides therewith, and the information signal detector 9b are disposed between the objective lens 6 and the deflectors 7a, 7b. Since the information signal electron 15 generated from the sample 8 and traveling over the objective lens 6 is inversely decelerated by a decelerating electric field applied between the objective lens 6 and the sample 8, it is not sufficiently deflected by the orthogonal electric field/magnetic field generator (L) 24 and collides with the electrode (L) 25, with a result that a secondary electron 15a is discharged from the electrode (L) 25. The secondary electron 15a is deflected on the information signal detector 9b side by the orthogonal electric field/magnetic field generator (L) 24 and thereby it can be detected by the information signal detector 9b. The electron signals thus detected by the information signal detector 9b are supplied through the amplifier 21 to the image display 13, and an enlarged image of the sample is displayed on the image display 13. According to the configuration shown in FIG. 8, even in the case where a negative voltage is applied to the sample 8, the information signal generated from the sample 8 can be efficiently detected. The negative voltage applied to the sample 8 can be reduced to 0 V by a voltage switching means 51. At this time, of the information signal electrons 15 generated from the sample 8, those having low energies are directly deflected on the information signal detector 9b side by the orthogonal electric field/magnetic field generator (L) 24; however, those having high energies are not sufficiently deflected by the orthogonal electric field/magnetic field generator (L) 24 and they collide with the electrode (L) 25. The high energy information signal electron having collided with the electrode (L) 25 is converted into a secondary electron by the electrode (L) 25 and is deflected on the information signal detector 9b side by the orthogonal electric field/magnetic field generator (L) 24 to be thus detected by the information signal detector 9b.

Figure 12:
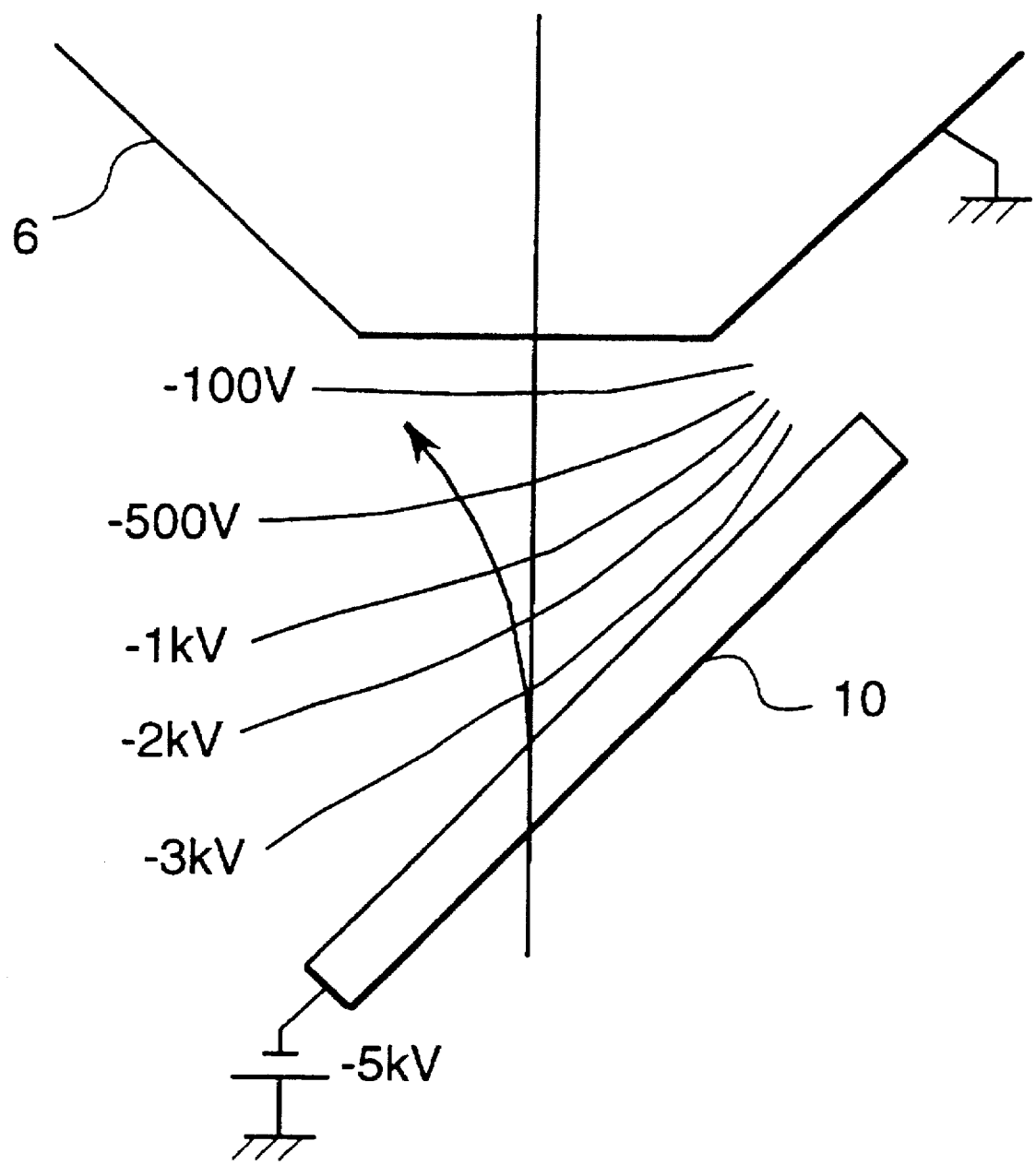
FIG. 12 is a view showing a disturbance of an equipotential line generated between a sample and an objective lens by tilting of the sample applied with a negative voltage.

In addition, when the sample stage 10 is tilted in a state in which the sample 8 is applied with a negative voltage, there occurs the disturbance of an equipotential line shown in FIG. 12 between the objective lens 6 having the grounding potential and the sample 8. The example of FIG. 12 shows the case where a negative voltage, −5 kV is applied to the sample 8. Since the objective lens 6 has the grounding potential (0 V), a potential difference is generated between the sample 8 and the objective lens 6. The information signal electron 15 is more strongly deflected on the tilting direction by the disturbance of the equipotential line. In this embodiment, to cope with such an inconvenience, a voltage applied to the deflecting electrode 17 is controlled in such a manner as to cancel the disturbance of the equipotential line. Although the disturbance of the equipotential line exerts an effect on the primary electron to cause the aberration, such an inconvenience can be also solved by controlling a voltage applied to the deflecting electrode 17.

When a negative voltage is applied to the sample 8, the information signal electron 15 is accelerated and thereby it has a stronger energy as described above, and accordingly it is desired that a voltage applied to the deflecting electrode is controlled to generate a stronger deflecting action. For example, when a negative voltage is applied to the sample, a voltage applied to the deflecting electrode may be controlled to be larger than a voltage applied to the deflecting electrode when such a negative voltage is not applied to the sample. A voltage applied to the deflecting electrode, however, should be practically determined on the basis of various requirements such as a tilting angle of the sample stage, initial velocity of the primary electron bema, kind of an information signal electron to be detected, and a working distance.

Further, in this embodiment, the information signal electron is lifted and the primary electron beam is accelerated using the lifting electrode 16 as described above. And, a voltage applied to the lifting electrode 16 is positive for achieving the function thereof. Namely, in this case, there may be considered that there occurs the same problem as that in the case of applying a negative voltage to the sample. Concretely, since a positive voltage is applied on the objective lens 6 side, when the sample stage is tilted, there occurs the same disturbance of the equipotential appearing in the example shown in FIG. 12.

Additionally, in the case where a positive voltage is applied to the lifting electrode and further a negative voltage is applied to the sample, a potential difference between the objective lens and the sample becomes larger, and the disturbance of the equipotential line generated when the sample is tilted also becomes larger.

The technique described in this embodiment of the present invention in which the disturbance of the equipotential line is controlled by the deflecting electrode is particularly effective to solve the above problem.

Figure 9:
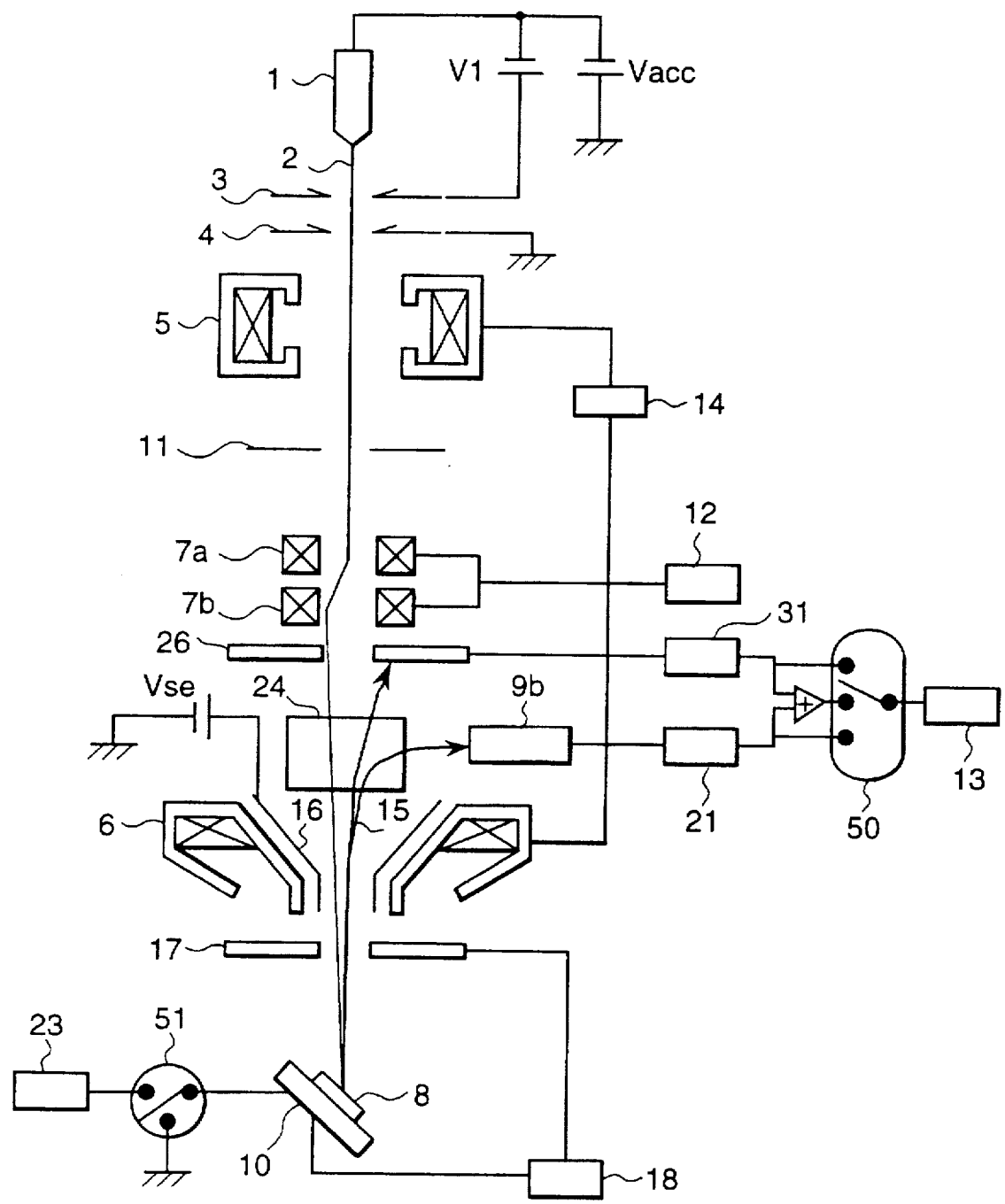
FIG. 9 is a view showing an example in which the electrode shown in FIG. 8 is replaced with a detector having a function of generating a light or electric signal when an electron collides therewith.

FIG. 9 shows an embodiment in which the electrode (L) 25 shown in FIG. 8 is replaced with a detector (L) 26 having a function generating a light or electric signal when an electron collides therewith. When a negative voltage is applied to the sample 8, a signal generated from the detector (L) 26 corresponds to the amount of information signal electrons generated from the sample 8 and then accelerated between the sample 8 and the objective lens 6. On the other hand, when a voltage applied to the sample 8 becomes 0 V, the signal corresponds to only the amount of those having high energies of the information signal electrons. At this time, of the information signals, those having low energies are directly defected by the orthogonal electric field/magnetic field generator (L) 24 to be thus detected by the detector 9b. The signals of the detectors 26, 9b are selected to be used either as independent signals or as a synthesized signal. The information signal thus selected is supplied through an amplifier 31 to the image display 13, and consequently an enlarged image of the sample can be displayed on the image display unit 13.

Since the electrode (L) 25 and the detector (L) 26 are disposed around or in the vicinity of the optic axis, the deflecting ranges of the deflectors 7a, 7b are restricted by the electrode (L) 25 and the detector (L) 26, with a result that there occurs a problem in restricting an observation field. To solve such a problem, the electrode (L) 25 and the detector (L) 26 are configured to be movable, and in the case where the observation field is required to be enlarged, they can be separated to a position at which they do not restrict the deflecting range of the primary electron beam.

Figure 10:
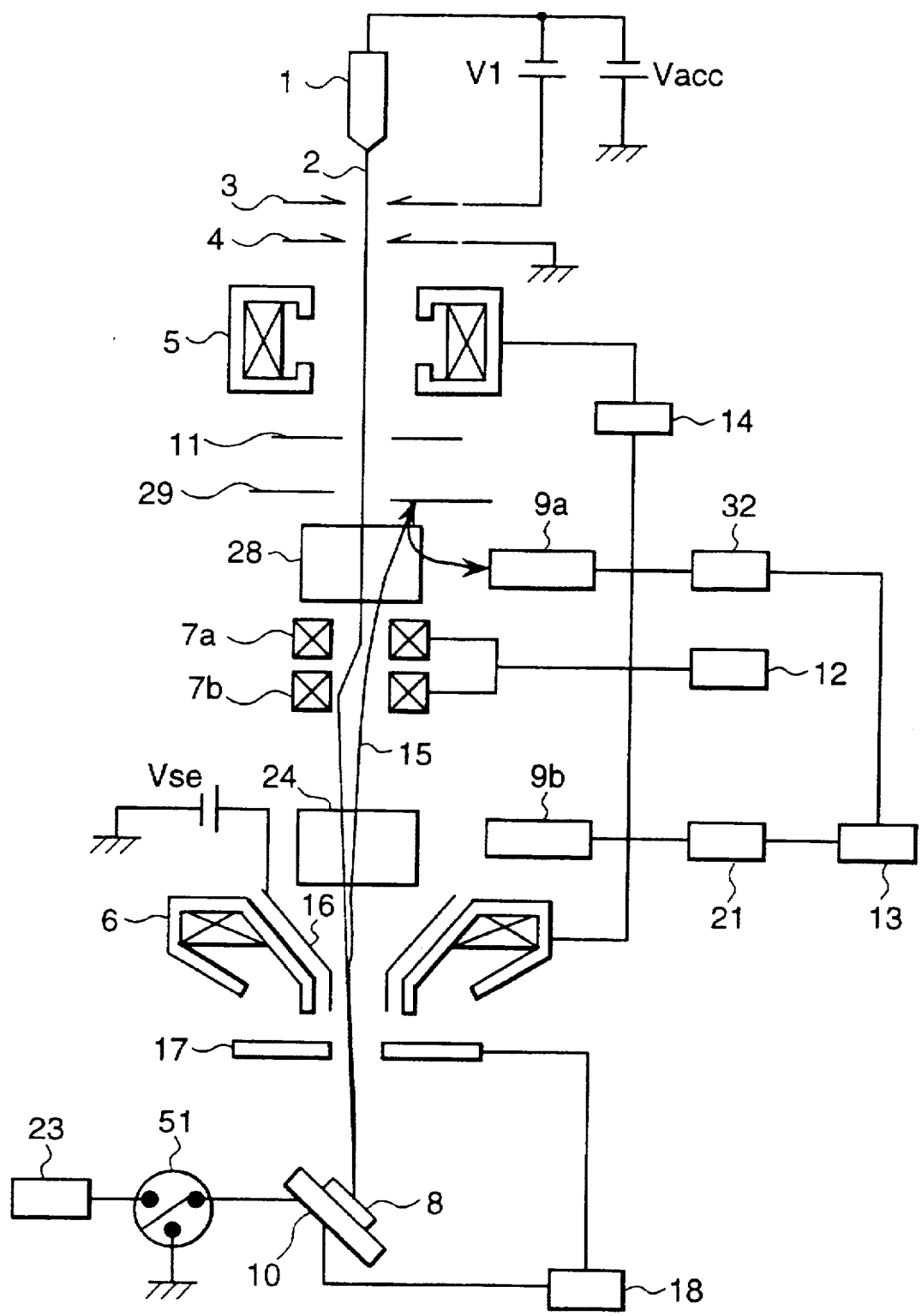
FIG. 10 is a view showing an example in which an information signal electron generated from a sample can be detected at a high efficiency without restricting a deflecting range of a primary electron beam.

FIG. 10 shows an embodiment in which an information signal electron generated from a sample can be detected at a high efficiency without restricting the deflecting range of a primary electron beam. Referring to FIG. 10, an electrode (U) 29 corresponding to the electrode (L) 25 shown in FIG.

8 is disposed on the electron source side from the deflectors 7a, 7b. Accordingly, the electrode (U) 29 can be formed with a small aperture in such a range as not to cutoff a primary electron beam having passed through a restricting sheet 11. An orthogonal electric field/magnetic field generator (U) 28 is disposed between the electrode (U) 29 and the deflector 7a, and accordingly, of the information signal electrons generated from the sample, those having collided with the electrode (U) 29 are converted into secondary electrons by the electrode (U) 29 and deflected on the information signal detector 9a side by the orthogonal electric field/magnetic field generator (U) 28, to be thus detected.

Figure 11:
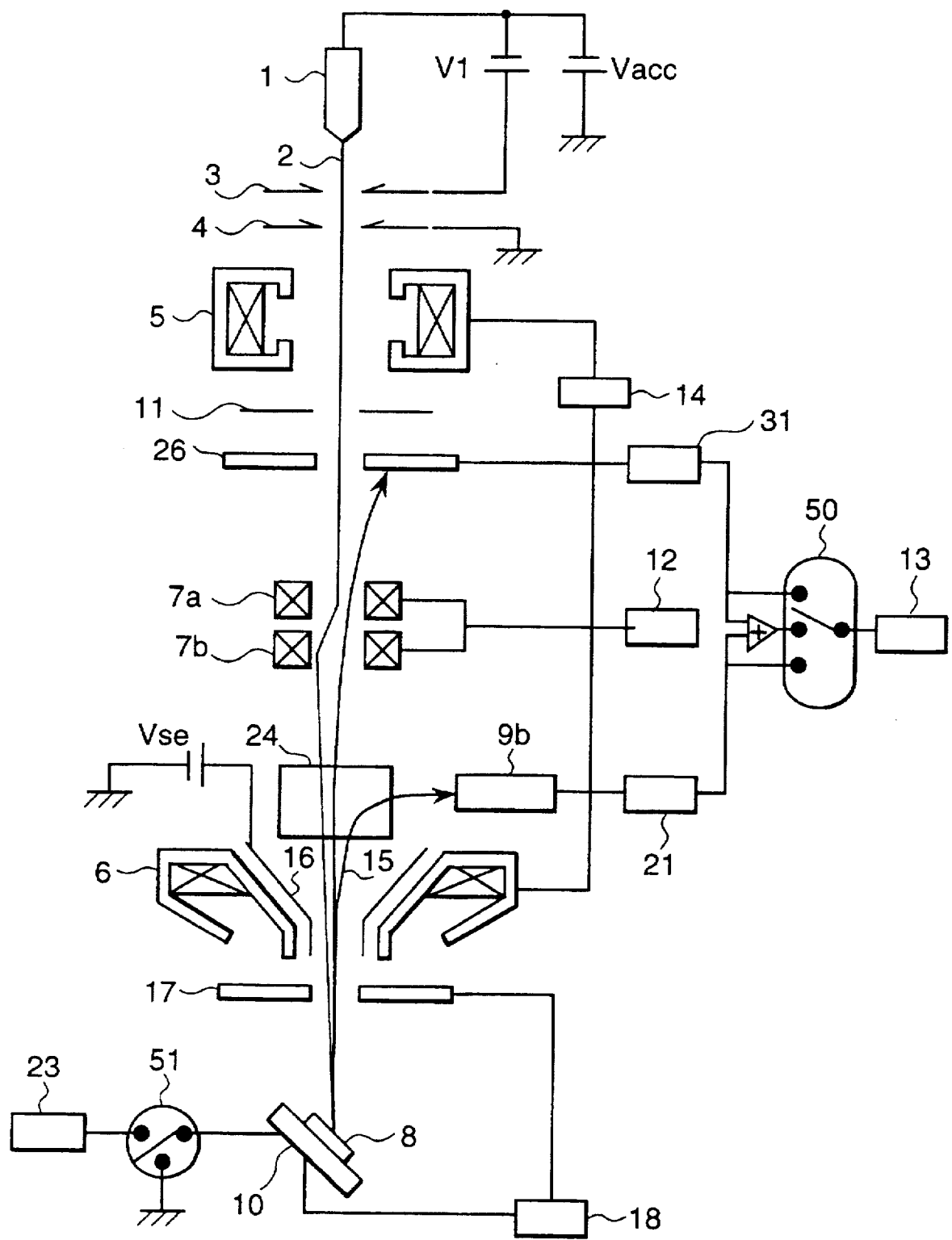
FIG. 11 is a view showing an example in which the electrode shown in FIG. 10 is replaced with a detector capable of generating a light or electric signal when an electron collides therewith.

FIG. 11 shows another embodiment in which the electrode (U) 29 shown in FIG. 10 is replaced with a detector 30 capable of generating a light or electric signal when an electron collides therewith. The detector 30 can directly detect a signal electron having collided with the detector 30, to thereby eliminate the necessity of the provision of the orthogonal electric field/magnetic field generator (U) 28 and the detector 9a.

In the scanning electron microscope and its analogous device capable of improving the resolution by making higher an energy of a primary electron during passing through a magnetic field of an objective lens than that of the primary electron irradiated on a sample, even when the sample is tilted at an arbitrary angle, an information signal electron generated from the sample can be detected at a high efficiency, and also the aberration of the primary electron beam can be reduced.

Since information signal electrons generated from a sample are separated from each other in terms of energies thereof and are selected to be used either as independent signals or a synthesized signal, it is possible to obtain the optimum contrast corresponding to the sample.

Further, since the disturbance of an equipotential line generated by tilting the sample in the case where a negative voltage is applied to the sample and/or a positive voltage is applied to a lifting electrode can be corrected, it is possible to reduce the aberration of a primary electron beam, and to improve the detection efficiency of an information signal electron.

What is claimed is:

1. A scanning electron microscope comprising:

an electron gun for generating an electron beam;

an objective lens for converging the electron beam to a sample so as to allow emission of the electron beam on the sample;

a deflector for deflecting the electron beam so as to allow the electron beam to scan the sample;

a detector for detecting an information signal, peculiar to the sample, generated from the sample by irradiation of the electron beam;

an orthogonal electric field/magnetic field generator for generating an electric field and a magnetic field orthogonal to each other with respect to said electron beam, wherein deflecting actions of said electric field and said magnetic field are controlled to cancel each other for said electron beam and to be exerted on said detector side for said information signal;

a means for tilting the sample with respect to the electron beam; and a means for correcting a nonaxiallysymmetric property, due to the tilting of the sample, of an electric field applied to the electron beam to be emitted on the sample;

wherein the nonaxiallysymmetric property correcting means includes a deflecting electrode means to which a variable voltage is applied for generating an electric field having a component in the direction perpendicular to an optical axis of the electron beam.

2. A scanning electron microscope according to claim 1, further comprising an electrode made of a material having a function of generating a secondary electron when an electron collides therewith, said electrode being disposed in the vicinity of the optical axis of said electron beam, wherein said detector is positioned in the vicinity of said electrode.

3. A scanning electron microscope according to claim 2, further comprising an electrode made of a material having a function of generating a secondary electron when an electron collides therewith, said electrode being disposed in the vicinity of the optical axis of said electron beam, and said orthogonal electric field/magnetic field generator for generating an electric field and a magnetic field which are orthogonal to each other with respect to said electron beam being disposed in the vicinity of said electrode made of a material having a function of generating a secondary electron.

4. A scanning electron microscope according to claim 2, wherein said electrode made of a material having a function of generating a secondary electron is disposed directly under a scanning electrode for scanning said electron beam and includes a moving mechanism for moving said electrode in the direction perpendicular to the optical axis of said electron beam.

5. A scanning electron microscope according to claim 1, further comprising an electrode for generating a light or electric signal when an electron collides therewith, said electrode being disposed in the vicinity of the optical axis of said electron beam and over said objective lens.

6. A scanning electron microscope according to claim 5, wherein said electrode for generating a light or electric signal when an electron collides therewith is disposed under a scanning electrode for scanning said electron beam and includes a moving mechanism for moving said electrode in the direction perpendicular to the optical axis of said electron beam.

7. A scanning electron microscope according to claim 1, further comprising an electrode for generating a light or electric signal when an electron collides therewith, said electrode being disposed in the vicinity of the optical axis of said electron beam and over an scanning electrode for scanning said electron beam, and a means for converting said light or electric signal into an image signal.

8. A scanning electron microscope comprising:

an electron gun for generating an electron beam;

an objective lens for converging the electron beam to a sample so as to allow emission of the electron beam on the sample;

a deflector for deflecting the electron beam so as to allow the electron beam to scan the sample;

a detector for detecting an information signal, peculiar to the sample, generated from the sample by irradiation of the electron beam;

a means for tilting the sample with respect to the electron beam; and a means for correcting a nonaxisymmetric property, due to the tilting of the sample, of an electric field applied to the electron beam to be emitted on the sample;

wherein the nonaxisymmetric property correcting means includes a deflecting electrode means to which a variable voltage is applied for generating an electric field having a component in the direction perpendicular to an optical axis of the electron beam; and a control unit for controlling, when a negative voltage is applied to said sample, a voltage applied to said deflecting electrode to be larger than a voltage applied to said deflecting electrode in the case where no negative voltage is applied to said sample.

9. A scanning electron microscope according to claim 8, further comprising an electrode made of a material having a function of generating a secondary electron when an electron collides therewith, said electrode being disposed in the vicinity of the optical axis of said electron beam, wherein said detector is positioned in the vicinity of said electrode.

10. A scanning electron microscope according to claim 9, further comprising an electrode made of a material having a function of generating a secondary electron when an electron collides therewith, said electrode being disposed in the vicinity of the optical axis of said electron beam, and an orthogonal electric field/magnetic field generator for generating an electric field and a magnetic field which are orthogonal to each other with respect to said electron beam, said generator being disposed in the vicinity of said electrode made of a material having a function of generating a secondary electron.

11. A scanning electron microscope according to claim 9, wherein said electrode made of a material having a function of generating a secondary electron is disposed directly under a scanning electrode for scanning said electron beam and includes a moving mechanism for moving said electrode in the direction perpendicular to the optical axis of said electron beam.

12. A scanning electron microscope according to claim 8, further comprising an electrode for generating a light or electric signal when an electron collides therewith, said electrode being disposed in the vicinity of the optical axis of said electron beam and over said objective lens.

13. A scanning electron microscope according to claim 12, wherein said electrode for generating a light or electric signal when an electron collides therewith is disposed under a scanning electrode for scanning said electron beam and includes a moving mechanism for moving said electrode in the direction perpendicular to the optical axis of said electron beam.

14. A scanning electron microscope according to claim 8, further comprising an electrode for generating a light or electric signal when an electron collides therewith, said electrode being disposed in the vicinity of the optical axis of said electron beam and over an scanning electrode for scanning said electron beam, and a means for converting said light or electric signal into an image signal.

15. A scanning electron microscope comprising:

an electron gun for generating an electron beam;

an objective lens for converging the electron beam to a sample so as to allow emission of the electron beam on the sample;

a deflector for deflecting the electron beam so as to allow the electron beam to scan the sample;

a detector for detecting an information signal, peculiar to the sample, generated from the sample by irradiation of the electron beam;

a means for tilting the sample with respect to the electron beam; and a means for correcting a nonaxiallysymmetric property, due to the tilting of the sample, of an electric field applied to the electron beam to be emitted on the sample;

wherein the nonaxiallysymmetric property correcting means includes a deflecting electrode means to which a variable voltage is applied for generating an electric field having a component in the direction perpendicular to an optical axis of the electron beam; and a control means for controlling, when a positive voltage is applied to said sample, a voltage applied to said deflecting electrode to be larger than a voltage applied to said deflecting electrode in the case where no positive voltage is applied to said electrode.

16. A scanning electron microscope according to claim 15 further comprising an electrode made of a material having a function of generating a secondary electron when an electron collides therewith, said electrode being disposed in the vicinity of the optical axis of said electron beam, wherein said detector is positioned in the vicinity of said electrode.

17. A scanning electron microscope according to claim 16, further comprising an electrode made of a material having a function of generating a secondary electron when an electron collides therewith, said electrode being disposed in the vicinity of the optical axis of said electron beam, and an orthogonal electric field/magnetic field generator for generating an electric field and a magnetic field which are orthogonal to each other with respect to said electron beam, said generator being disposed in the vicinity of said electrode made of a material having a function of generating a secondary electron.

18. A scanning electron microscope according to claim 16, wherein said electrode made of a material having a function of generating a secondary electron is disposed directly under a scanning electrode for scanning said electron beam and includes a moving mechanism for moving said electrode in the direction perpendicular to the optical axis of said electron beam.

19. A scanning electron microscope according to claim 15, further comprising an electrode for generating a light or electric signal when an electron collides therewith, said electrode being disposed in the vicinity of the optical axis of said electron beam and over said objective lens.

20. A scanning electron microscope according to claim 19, wherein said electrode for generating a light or electric signal when an electron collides therewith is disposed under a scanning electrode for scanning said electron beam and includes a moving mechanism for moving said electrode in the direction perpendicular to the optical axis of said electron beam.

21. A scanning electron microscope according to claim 15, further comprising an electrode for generating a light or electric signal when an electron collides therewith, said electrode being disposed in the vicinity of the optical axis of said electron beam and over an scanning electrode for scanning said electron beam, and a means for converting said light or electric signal into an image signal.

22. A scanning electron microscope comprising:

an electron gun for generating an electron beam;

an objective lens for converging the electron beam to a sample so as to allow emission of the electron beam on the sample;

a deflector for deflecting the electron beam so as to allow the electron beam to scan the sample said deflector;

a detector for detecting an information signal, peculiar to the sample, generated from the sample by irradiation of the electron beam;

a means for tilting the sample with respect to the electron beam; and a means for correcting a nonaxiallysymmetric property, due to the tilting of the sample, of an electric field applied to the electron beam to be emitted on the sample;

wherein the nonaxiallysymmetric property correcting means includes a deflecting electrode means, made of a member having a function of generating a light or electric signal when an electron collides therewith, to which a variable voltage is applied for generating an electric field having a component in the direction perpendicular to an optical axis of the electron beam; and a means for converting said light or electric signal into an image signal.

23. A scanning electron microscope according to claim 22, further comprising an electrode made of a material having a function of generating a secondary electron when an electron collides therewith, said electrode being disposed in the vicinity of the optical axis of said electron beam, wherein said detector is positioned in the vicinity of said electrode.

24. A scanning electron microscope according to claim 23, further comprising an electrode made of a material having a function of generating a secondary electron when an electron collides therewith, said electrode being disposed in the vicinity of the optical axis of said electron beam, and an orthogonal electric field/magnetic field generator for generating an electric field and a magnetic field which are orthogonal to each other with respect to said electron beam, said generator being disposed in the vicinity of said electrode made of a material having a function of generating a secondary electron.

25. A scanning electron microscope according to claim 23, wherein said electrode made of a material having a function of generating a secondary electron is disposed directly under a scanning electrode for scanning said electron beam and includes a moving mechanism for moving said electrode in the direction perpendicular to the optical axis of said electron beam.

26. A scanning electron microscope according to claim 22, further comprising an electrode for generating a light or electric signal when an electron collides therewith, said electrode being disposed in the vicinity of the optical axis of said electron beam and over said objective lens.

27. A scanning electron microscope according to claim 26, wherein said electrode for generating a light or electric signal when an electron collides therewith is disposed under a scanning electrode for scanning said electron beam and includes a moving mechanism for moving said electrode in the direction perpendicular to the optical axis of said electron beam.

28. A scanning electron microscope according to claim 22, further comprising an electrode for generating a light or electric signal when an electron collides therewith, said electrode being disposed in the vicinity of the optical axis of said electron beam and over an scanning electrode for scanning said electron beam, and a means for converting said light or electric signal into an image signal.

* * * * *